(12) United States Patent
Choi et al.

(10) Patent No.: US 8,665,580 B2
(45) Date of Patent: Mar. 4, 2014

(54) EMBEDDED CAPACITOR AND METHOD OF FABRICATING THE SAME

(75) Inventors: Jae Bong Choi, Seoul (KR); Sang Hyeok Nam, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 179 days.

(21) Appl. No.: 13/121,618

(22) PCT Filed: Oct. 30, 2009

(86) PCT No.: PCT/KR2009/006341
§ 371 (c)(1),
(2), (4) Date: Mar. 29, 2011

(87) PCT Pub. No.: WO2010/050773
PCT Pub. Date: May 6, 2010

(65) Prior Publication Data
US 2011/0194229 A1    Aug. 11, 2011

(30) Foreign Application Priority Data

Oct. 30, 2008 (KR) .................. 10-2008-0107370

(51) Int. Cl.
*H01G 4/10* (2006.01)
*H05K 1/16* (2006.01)
(52) U.S. Cl.
USPC ......................................... 361/322; 361/766
(58) Field of Classification Search
USPC ................... 361/311, 322, 765, 766
See application file for complete search history.

(56) References Cited

U.S. PATENT DOCUMENTS

| 6,370,012 B1* | 4/2002 | Adae-Amoakoh et al. ............ 361/306.3 |
| 6,461,493 B1* | 10/2002 | Farooq et al. ................. 205/118 |
| 6,882,544 B2* | 4/2005 | Nakamura et al. ........... 361/765 |
| 6,992,896 B2* | 1/2006 | Fraley et al. .................. 361/719 |
| 7,531,011 B2 | 5/2009 | Yamasaki |
| 2002/0146850 A1 | 10/2002 | Choi |
| 2004/0239349 A1 | 12/2004 | Yamagishi et al. |
| 2006/0017115 A1 | 1/2006 | Tu et al. |
| 2007/0097597 A1 | 5/2007 | Ko et al. |
| 2008/0017902 A1 | 1/2008 | Wang |

FOREIGN PATENT DOCUMENTS

| CN | 1477691 | 2/2004 |
| JP | 55-166916 A | 12/1980 |
| JP | 2002-134358 A | 5/2002 |
| JP | 2005-191266 A | 7/2005 |
| KR | 2002-0065246 A | 8/2002 |
| KR | 10-2003-0047876 | 6/2003 |
| KR | 2003-0054310 A | 7/2003 |
| KR | 10-2006-0072223 A | 6/2006 |
| KR | 10-0691437 | 2/2007 |
| KR | 10-2007-0106566 | 11/2007 |

OTHER PUBLICATIONS

Chinese Certificate of Registration dated Nov. 13, 2013 in Chinese Application No. 200980140939.5, filed Oct. 30, 2009.

* cited by examiner

*Primary Examiner* — David M Sinclair
(74) *Attorney, Agent, or Firm* — Saliwanchik, Lloyd & Eisenschenk

(57) ABSTRACT

Disclosed are an embedded capacitor and a method of fabricating the same. The capacitor includes a metallic substrate, a metallic oxide layer on the metallic substrate, a first electrode layer on a first surface of the metallic oxide layer, and a second electrode layer on a second surface of the metallic oxide layer.

9 Claims, 2 Drawing Sheets

EMBEDDED CAPACITOR AND METHOD OF FABRICATING THE SAME

CROSS-REFERENCE TO RELATED APPLICATIONS

This application is the U.S. national stage application of International Patent Application No. PCT/KR2009/006341, filed Oct. 30, 2009, which claims priority to Korean Application No. 10-2008-0107370, filed Oct. 30, 2008, the disclosures of each of which are incorporated herein by reference in their entirety.

TECHNICAL FIELD

The present application claims priority of Korean Patent Application No. 10-2008-0107370 filed on Oct. 30, 2008, which is hereby incorporated by reference in its entirety.

The embodiment relates to an embedded capacitor and a method of manufacturing the same.

BACKGROUND ART

Recently, various researches and studies have been carried out in order to fabricate embedded capacitors.

For example, although an insulator of the embedded capacitor including barium titanic oxide is applied to a PCB (Printed Circuit Board), the barium titanic oxide is molded at a high temperature of about 900. Accordingly, the barium titanic oxide cannot be applied to the PCB based on epoxy resin that cannot withstand a high temperature. In addition, the product yield and the manufacturing cost are increased.

Therefore, researches and studies have been performed toward embedded capacitors that are molded at a low temperature to be applicable to a PCB and do not require a baking process.

DISCLOSURE

Technical Problem

The embodiment provides a capacitor having a novel structure and a method of fabricating the same.

The embodiment provides an embedded capacitor having a novel structure and a method of fabricating the same.

The embodiment provides a capacitor and a method of fabricating the same in which the capacitor can be fabricated without a high temperature baking process.

The embodiment provides an embedded capacitor capable of representing superior heat radiation effect and a method of fabricating the same.

Technical Solution

According to the embodiment, a capacitor includes a metallic substrate, a metallic oxide layer on the metallic substrate, a first electrode layer on a first surface of the metallic oxide layer, and a second electrode layer on a second surface of the metallic oxide layer.

According to the embodiment, an embedded capacitor includes a metallic substrate provided in a multi-layer circuit substrate, a metallic oxide layer on the metallic substrate, a first electrode layer on a first surface of the metallic oxide layer, a second electrode layer on a second surface of the metallic oxide layer, an insulating layer on first and second surfaces of the metallic substrate to surround the first and second electrodes, and a via passing through the insulating layer and electrically connected to the first and second electrode layers, and a circuit pattern electrically connected to the via.

According to the embodiment a method of fabricating a capacitor includes forming photoresist patterns on first and second surfaces of a metallic substrate, selectively forming a metallic oxide layer on the metallic substrate by performing an oxidation process with respect to the metallic substrate by using the photoresist patterns as a mask, and forming first and second electrode layers on first and second surfaces of the metallic oxide layer, respectively.

According to the embodiment, a method of fabricating an embedded capacitor includes forming photoresist patterns on first and second surfaces of a metallic substrate, selectively forming a metallic oxide layer on the metallic substrate by performing an oxidation process with respect to the metallic substrate by using the photoresist patterns as a mask, forming first and second electrode layers on first and second surfaces of the metallic oxide layer, respectively, forming an insulating layer on the first and second surfaces of the metallic substrate to surround the first and second electrode layers, and forming a via passing through the insulating layer and electrically connected to the first and second electrode layers, and a circuit pattern electrically connected to the via.

Advantageous Effects

The embodiment can provide a capacitor having a novel structure and a method of fabricating the same.

The embodiment can provide an embedded capacitor having a novel structure and a method of fabricating the same.

The embodiment can provide a capacitor and a method of fabricating the same in which the capacitor can be fabricated without a high temperature baking process.

The embodiment can provide an embedded capacitor capable of representing superior heat radiation effect and a method of fabricating the same.

BEST MODE

Mode for Invention

Figure 1:
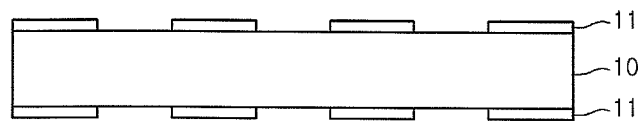
FIGS. 1 to 6 are sectional views used to explain a method of fabricating an embedded capacitor according to the embodiment.

In the description of the embodiments, it will be understood that, when a layer (or film), a region, a pattern, or a structure is referred to as being "on" or "under" another substrate, another layer (or film), another region, another pad, or another pattern, it can be "directly" or "indirectly" over the other substrate, layer (or film), region, pad, or pattern, or one or more intervening layers may also be present. Such a position of the layer has been described with reference to the drawings.

The thickness and size of each layer shown in the drawings may be exaggerated, omitted or schematically drawn for the purpose of convenience or clarity. In addition, the size of elements does not utterly reflect an actual size.

Hereinafter, an embedded capacitor and a method of fabricating the same according to the embodiment will be described in detail with reference to accompanying drawings.

FIGS. 1 to 6 are sectional views used to explain a method of fabricating an embedded capacitor according to the embodiment.

Referring to FIG. 1, a metallic substrate 10 is prepared. The metallic substrate 10 has a thickness of about 0.3 μm to about 100 μm, and may include one selected from the group consisting of aluminum (Al), the alloy thereof mainly including Al, magnesium (Mg), the alloy thereof mainly including Mg, titanium (Ti), and the alloy thereof mainly including Ti. For example, the metallic substrate 10 may include Al.

Then, photoresist patterns 11 are formed on top and bottom surfaces of the metallic substrate 10. The photoresist patterns 11 are formed corresponding to each other on the top and bottom surfaces of the metallic substrate 10.

Figure 2:
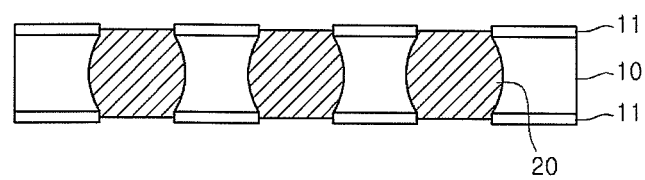

Referring to FIG. 2, an oxidation process is performed with respect to the metallic substrate 10 having the photoresist patterns 11.

As the oxidation process is performed with respect to the metallic substrate 10, a metallic oxide layer 20 is formed at a region without the photoresist pattern 11. The metallic oxide layer 20 serves as a dielectric substance of a capacitor. The metallic oxide layer 20 may include a material selected from the group consisting of Al, the alloy thereof, Ti, the alloy thereof, Mg, and the alloy thereof.

For example, when the metallic substrate 10 includes Al, and the metallic substrate 10 is anodized, the metallic oxide layer 20 may include aluminum oxide layer ($Al_2O_3$).

Figure 3:
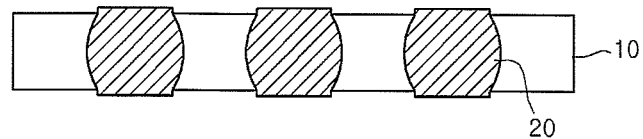

Referring to FIG. 3, after an oxidation process has been performed with respect to the metallic substrate 10 and the metallic oxide layer 20 has been formed, the photoresist patterns 11 are removed.

Figure 4:
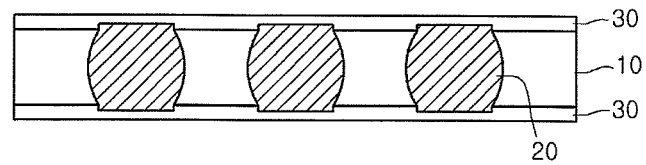

Referring to FIG. 4, a conductive layer 30 is formed on the top and bottom surfaces of the metallic substrate 10 having the metallic oxide layer 20. The conductive layer 30 may be formed through a sputtering process or a deposition process. For example, the conductive layer 30 may include copper (Cu).

Figure 5:
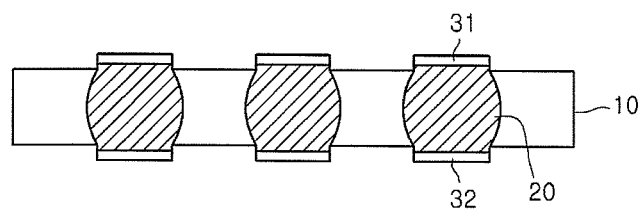

Referring to FIG. 5, first and second electrode layers 31 and 32 are formed on the metallic oxide layer 20 by patterning the conductive layer 30.

Accordingly, a capacitor including the first electrode layer 31, the metallic oxide layer 20, and a second electrode layer 32 is fabricated.

According to the embodiment, an anodizing process is performed with respect to an aluminum substrate having a thickness of about 7 μm. The anodizing process is performed under a temperature of 18 for 30 minutes under a condition in which the distance between the electrode and the aluminum substrate is about 15 cm, and a voltage is about 50V. Accordingly, the capacitor including the aluminum oxide layer, the first copper electrode layer, and the second copper electrode layer has capacitance of about 100 $pF/mm^2$ and sheet resistance (Rs) of about 2 MΩ.

Meanwhile, the capacitor, which is fabricated by forming the metallic oxide layer 20 as a dielectric layer by performing the oxidation process with respect to the metallic substrate 10 and forming the first and second electrode layers 31 and 32 on the top and bottom surfaces of the metallic oxide layer 20, may be embedded in a multi-layer PCB.

Figure 6:
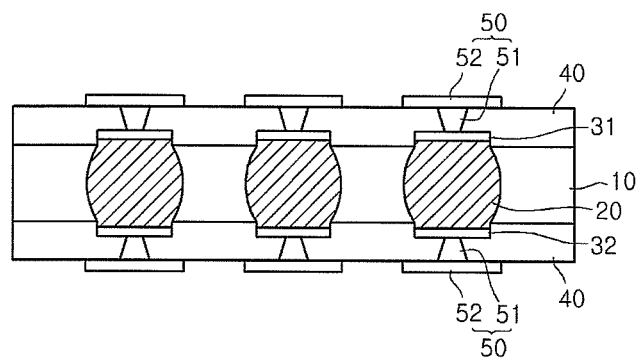

Referring to FIG. 6, an insulating layer 40 is formed on the top and bottom surfaces of the metallic substrate 10. The insulating layer 40 may include a resin material such as an epoxy resin.

Then, a via 51 is formed through the insulating layer 40 and electrically connected to the first and second electrode layers 31 and 32. Circuit patterns 52 are formed on the top and bottom of the insulating layer 40 so that the circuit patterns 52 are electrically connected to the via 51.

In addition, an insulating layer, a via, and circuit patterns may be additionally repeated on the top and bottom of the insulating layer 40 and the circuit pattern 52.

Therefore, the capacitor may be embedded in the multi-layer PCB including the insulating layer, the via, and the circuit pattern. The capacitor may be provided at an intermediate layer of the multi-layer PCB, or may be biased to the top side or the bottom side of the multi-layer PCB.

The metallic substrate 10 represents superior thermal conductivity in the capacitor according to the embodiment. Accordingly, if the capacitor is positioned inside the multi-layer PCB, heat emitted from the inner part of the PCB can be easily discharged to the outside.

In addition, since the dielectric substance is formed through the anodizing process in the capacitor according to the embodiment, a high-temperature baking process is not required. Accordingly, the capacitor can be effectively embedded in the PCB based on a resin material.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

INDUSTRIAL APPLICABILITY

The embodiment is applicable to a capacitor and an embedded capacitor.

The invention claimed is:

1. An embedded capacitor comprising:
    a metallic substrate provided in a multi-layer circuit substrate;
    a metallic oxide layer in the metallic substrate;
    a first electrode layer on a first side of an outer surface of the metallic oxide layer;
    a second electrode layer on a second side of an outer surface of the metallic oxide layer;
    an insulating layer on first and second surfaces of the metallic substrate to surround the first and second electrodes; and
    a via passing through the insulating layer and electrically connected to the first and second electrode layers, and a circuit pattern electrically connected to the via,
    wherein a thickness of the metallic oxide layer is the same as a distance between the first electrode layer and the second electrode layer.

2. The embedded capacitor of claim 1, wherein the insulating layer includes epoxy resin.

3. The capacitor of claim 1, wherein the metallic substrate includes one selected from the group consisting of aluminum (Al), the alloy thereof mainly including Al, titanium (Ti), the alloy thereof mainly including Ti, magnesium (Mg), and the alloy thereof mainly including Mg.

4. A method of fabricating a capacitor, the method comprising:
   forming photoresist patterns on first and second surfaces of a metallic substrate;
   selectively forming a metallic oxide layer in the metallic substrate by performing an oxidation process with respect to the metallic substrate by using the photoresist patterns as a mask; and
   forming first and second electrode layers on first and second sides of an outer surface of the metallic oxide layer, respectively,
   wherein the outer surface of the metallic oxide layer is in direct contact with the metallic substrate.

5. The method of claim 4, wherein the metallic substrate has a thickness of about 0.3 µm to about 100 µm.

6. The method of claim 4, wherein the metallic substrate includes one selected from the group consisting of aluminum (Al), the alloy thereof mainly including Al, titanium (Ti), the alloy thereof mainly including Ti, magnesium (Mg), and the alloy thereof mainly including Mg.

7. A method of fabricating an embedded capacitor, the method comprising:
   forming photoresist patterns on first and second surfaces of a metallic substrate;
   selectively forming a metallic oxide layer in the metallic substrate by performing an oxidation process with respect to the metallic substrate by using the photoresist patterns as a mask;
   forming first and second electrode layers on first and second sides of an outer surface of the metallic oxide layer, respectively;
   forming an insulating layer on the first and second surfaces of the metallic substrate to surround the first and second electrode layers; and
   forming a via passing through the insulating layer and electrically connected to the first and second electrode layers, and a circuit pattern electrically connected to the via,
   wherein a thickness of the metallic oxide layer is the same as a distance between the first electrode layer and the second electrode layer.

8. The method of claim 7, wherein the insulating layer includes epoxy resin.

9. The method of claim 7, wherein the metallic substrate includes one selected from the group consisting of aluminum (Al), the alloy thereof mainly including Al, titanium (Ti), the alloy thereof mainly including Ti, magnesium (Mg), and the alloy thereof mainly including Mg.

\* \* \* \* \*